(12) United States Patent
Ahn et al.

(10) Patent No.: US 6,407,947 B2
(45) Date of Patent: Jun. 18, 2002

(54) METHOD OF ERASING A FLASH MEMORY DEVICE

(75) Inventors: Byung Jin Ahn, Seoul; Hee Hyun Chang, Sungnam-shi, both of (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 11 days.

(21) Appl. No.: 09/882,106

(22) Filed: Jun. 15, 2001

(30) Foreign Application Priority Data

Jun. 27, 2000 (KR) ............................................. 00-35685

(51) Int. Cl.⁷ .............................................. G11C 16/04
(52) U.S. Cl. ............................ 365/185.29; 365/185.19; 365/185.22; 365/185.3
(58) Field of Search ....................... 365/185.29, 185.22, 365/185.3, 185.33, 218, 185.19

(56) References Cited

U.S. PATENT DOCUMENTS 5,991,206 A  * 11/1999  Shin ....................... 365/185.29
6,279,070 B1 *  8/2001  Jeong et al. ................. 711/103

* cited by examiner

*Primary Examiner*—David Nelms
*Assistant Examiner*—Gene N. Auduong
(74) *Attorney, Agent, or Firm*—Marshall, Gerstein, & Borun.

(57) ABSTRACT

Methods of erasing a flash memory device are disclosed. After performing a first erasure operation, the methods perform a second erasure operation wherein an erasure pulse width or an erasure voltage is increased if the number of erased cells is below a predetermined number of erased cells, and wherein an erasure pulse width or an erasure voltage is reduced if the number of erased cell is more than a predetermined number of erased cells.

22 Claims, 3 Drawing Sheets

METHOD OF ERASING A FLASH MEMORY DEVICE

FIELD OF THE INVENTION

The invention relates generally to a method of erasing a flash memory device, and more particularly, to a method of erasing a flash memory device while avoiding an over-erasure problem.

BACKGROUND OF THE INVENTION

A flash memory device performs an erasure operation by the Fowler-Nordheim (F-N) tunneling effect. This causes the efficiency of the memory device to vary based on the properties and thickness of a tunnel oxide film of about 100 Å (angstroms). As a result, its characteristics are not self-limited for a constant time. Therefore, due to changes occurring during various processes, the erasure rates of cells vary. This results in degradation in the characteristic distribution of the cells, that is, the distribution of the threshold voltage of the erased cells is variable.

A method of erasing a conventional flash memory device will now be explained with reference to FIG. 1. A pre-programming operation 11 is first performed by which cells in a selected block are programmed to increase the threshold voltages of certain cells before an erasure operation is performed. A verification process 12 is then performed. The pre-programming operation 11 is performed to prevent the phenomenon by which cells are over-erased. Over-erasure occurs when cells having a low threshold voltage after being erased are erased again thereby moving the twice erased cells to a further low threshold voltage.

After the threshold voltage of all of the cells is adjusted, an erasure operation is performed (block 13). Next, the state of erasure is verified 14. If the erasure is not sufficient, a series of operations are repeated by which the erasure operation is again performed. After all the cells are erased, and in order to solve the problem of over-erasure in some of the cells having a relatively fast rate of erasure characteristic, a post-programming operation 15 for preventing leakage current from over-erased cells and a verification operation 16 are performed, thus completing the erasure operation of the flash memory device. The programming operation 11 employs a channel hot electron, whereas the post-programming operation 16 employs an avalanche hot electron.

In this erasure method, the internal voltage upon erasure may vary depending on the manufacture process or operation condition, that is, the temperature and operation power supply.

The flash memory device operates from a common single external power supply and uses a charge pump having a step-up circuit for generating a high voltage in order to erase and store information. It stores information by regulating the high voltage internally generated into an adequate voltage.

The gain value of this voltage regulation circuit is dependent upon external factors. As a result, the internal voltage of the voltage regulation circuit is severely variable during erasure. This change of the internal voltage significantly affects the erasure rate of the cells. When the erasure voltage is low, the erasure rate is excessively lowered, thereby degrading the performance of the device. Whereas, when the erasure voltage is high, the erasure rate is rapidly increased, thus causing an over-erasure problem in which cells are over-erased because the erasure process occurs an unnecessary number of times.

As a result, when information is read from a cell, leakage current is generated from neighboring cells which have experienced over-erasure. To program the cell, information indicating an off-cell must be sensed. However, information erroneously indicating an on-cell will be sensed if the leakage current from neighboring, over-erased cells is excessive. When this occurs, erroneous operation of the device is caused.

SUMMARY OF THE INVENTION

In accordance with an aspect of the invention, a method of erasing a flash memory device is provided. The method comprises the steps of: (a) performing a preprogram operation in a selected sector having at least some cells; (b) adjusting a value in an address counter; (c) performing an erasure operation by applying an erasure pulse voltage to all of the cells; (d) verifying an erasure state of the cells on a per address unit basis; (e) performing a post programming operation if cells corresponding to a last address are erased; (f) if some cells are not erased, erasing all the cells; (g) determining whether a predetermined maximum number of erasure operations has been exceeded; (h) if the predetermined maximum number of the erasure operations has not been exceeded, determining a number of erased cells; (i) if the determined number of erased cells is below a predetermined minimum number of erased cells, increasing a pulse width of the erasure pulse voltage and repeating at least steps (c) through (g); (j) if the determined number of erased cells is more than a predetermined maximum number of erased cells, reducing the pulse width of the erasure pulse voltage and repeating at least steps (c) through (g); (k) if the determined number of erased cells is between the predetermined maximum number of erased cells and the predetermined minimum number of erased cells, repeating at least steps (c) through (g) without changing the width of the erasure pulse voltage; and (l) if the predetermined maximum number of erasure operations has been exceeded, determining that the flash memory device is defective.

In accordance with another aspect of the invention, a method of erasing a flash memory device is provided which includes the steps of: (a) performing a pre-program operation in a selected sector having at least some cells; (b) adjusting a value in an address counter; (c) performing an erasure operation by applying an erasure pulse voltage to all of the cells (d) verifying an erasure state of the cells on a per address unit basis; (e) performing a post programming operation if cells corresponding to a last address are erased; (f) if some cells are not erased, erasing all the cells; (g) determining whether a predetermined maximum number of erasure operations has been exceeded; (h) if the predetermined maximum number of the erasure operations has not been exceeded, determining a number of erased cells; (i) if the determined number of erased cells is below a predetermined minimum number of erased cells, increasing the erasure pulse voltage and repeating at least steps (c) through (g); (j) if the determined number of erased cells is more than a predetermined maximum number of erased cells, reducing the erasure pulse voltage and repeating at least steps (c) through (g); (k) if the determined number of erased cells is between the predetermined maximum number of erased cells and the predetermined minimum number of erased cells, repeating at least steps (c) through (k) without changing the erasure pulse voltage; and (l) if the pre determined maximum number of erasure operations has been exceeded, determining that the flash memory device is defective.

BRIEF DESCRIPTION OF THE DRAWINGS

Preferred examples will now be explained in conjunction with the accompanying drawings, wherein.

DETAILED DESCRIPTION OF PREFERRED EMBODIMENTS

Figure 1:
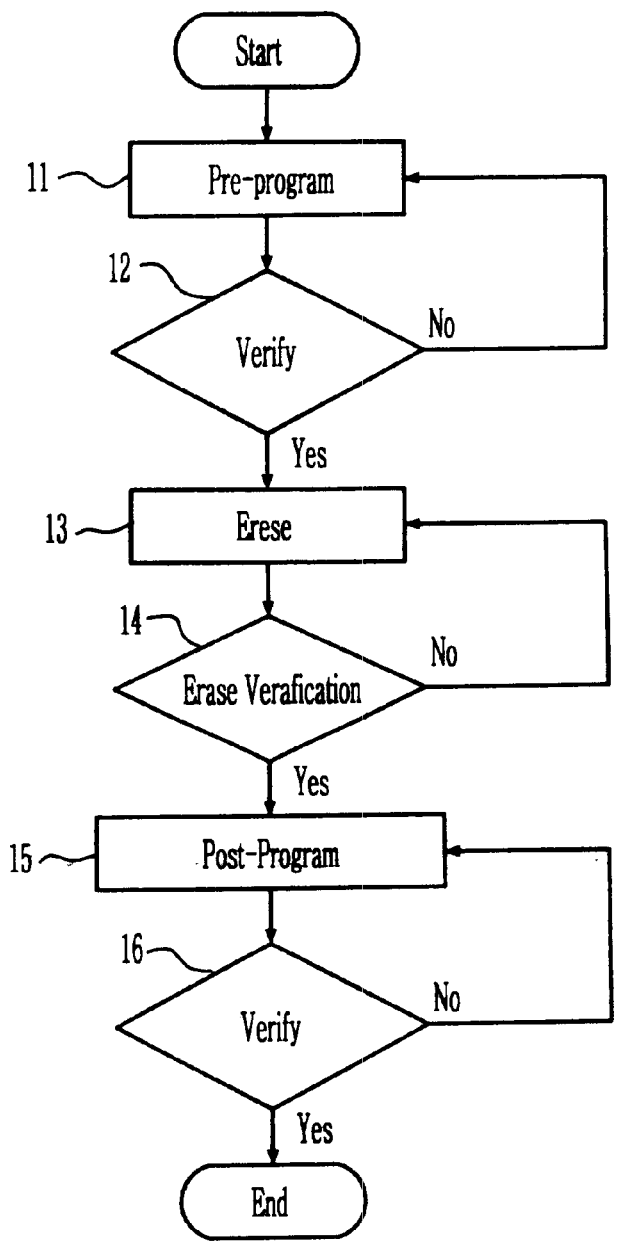
FIG. 1 is a flowchart illustrating a prior art method of erasing a conventional flash memory device.
Figure 2:
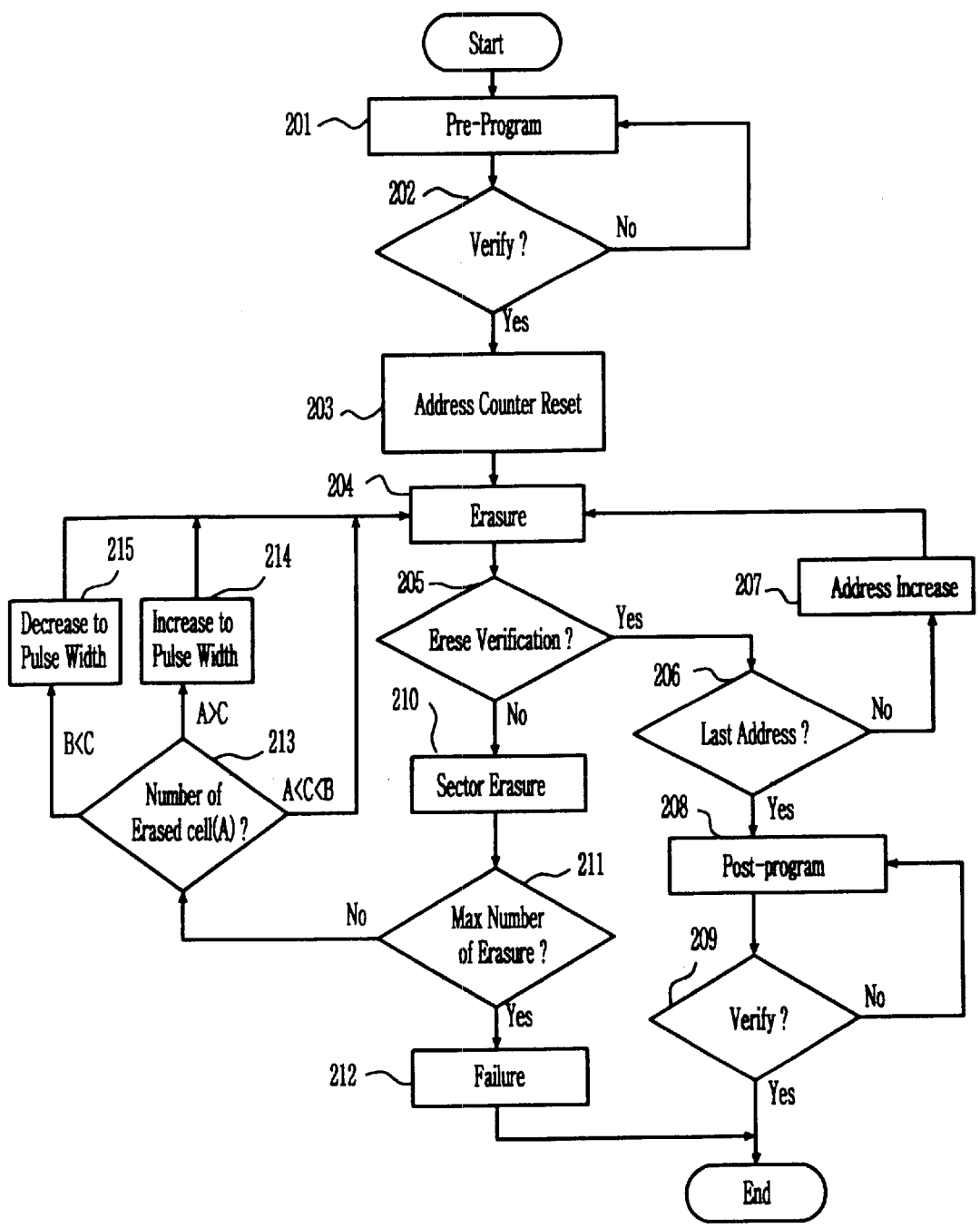
FIG. 2 is a flowchart illustrating a first exemplary method of erasing a flash memory device in accordance with the teachings of the present invention.

Referring now to FIG. 2, an exemplary method of erasing a flash memory device in accordance with the teachings of the present invention will be explained in detail. Before an erasure operation is performed on a programmed cell in a selected sector, a pre-programming operation for increasing the threshold voltage of cells in the sector (step 201), and a verification operation (step 202) to ensure the threshold voltages have been sufficiently raised, are performed. After the threshold voltages of all the cells are increased by the pre-programming operation (step 201), an erasure operation is performed on a per sector unit basis. First, after an address counter in the selected sector is reset (step 203), the erasure operation is performed by which an erasure voltage of unit pulse is applied (step 204). The erasure operation (step 204) is performed by applying an erasure voltage of −10V and 5V to a gate and a substrate, respectively. The erasure voltage can have, for example, a pulse width of 10 ms or 5 ms. Next, the erasure state of all the cells is verified (step 205) on a per address unit basis. If the verification determines that all of the cells are completely erased, it is verified whether the erasure has been performed up to the last address (step 206). If the verification determines that the erasure is not performed up to the last address, the address counter is increased (step 207), and the erasure and verification operation are performed (i.e., steps 204–207 are repeated) until cells corresponding to the last address are erased. When the last address is successfully erased (step 206), in order to avoid the over-erasure problem in cells having a relatively fast erasure characteristic, the erasure operation for the flash memory device is completed through a post-programming operation (step 208) and its verification operation (step 209).

If the verification in step 205 determines that some cells are not erased, all the cells in the sector are erased (step 210). Next, it is verified whether the number of times in which the sector erasure operation has been performed exceeds a predetermined maximum number of erasure operations (step 211). If the verification (step 211) determines that the maximum number of predetermined erasure operations is exceeded, it is determined that the device is defective (step 212), and the operation is thus completed. On the other hand, if the verification (step 211) determines that the maximum number of predetermined erasure operations have not been exceeded, the number (C) of erased cells in the sector is determined (step 213).

Based upon the determination in step 213, if the number of erased cells (C) is below the minimum number of predetermined erasure cells (A), it is determined that the erasure rate of the cells is slow. Thus, the pulse width of the erasure pulse is doubled (step 214) and the erasure operation (step 204) is performed again. In other words, the erasure operation (step 204) is performed by applying an erasure voltage of −10V and 5V to a gate and a substrate, respectively, wherein the erasure voltage has a pulse width of 20 ms or 10 ms.

On the other hand, based on the determination in step 213, if the number of erased cells (C) is more than the maximum number of predetermined erasure cells (B), it is determined that the erasure rate of the cells is fast. Thus, the pulse width of the erasure pulse is decreased in half (step 215) and the erasure operation (step 204) is repeated. In other words, the erasure operation (step 204) is performed by applying an erasure voltage of −10V and 5V to a gate and a substrate, respectively, wherein the erasure voltage has a pulse width of 5 ms or 2.5 ms. Also, if the number of erased cells (C) is between the maximum and minimum number of predetermined erasure cells (A) and (B), the erasure operation (step 204) is repeated without adjusting the pulse width.

Figure 3:
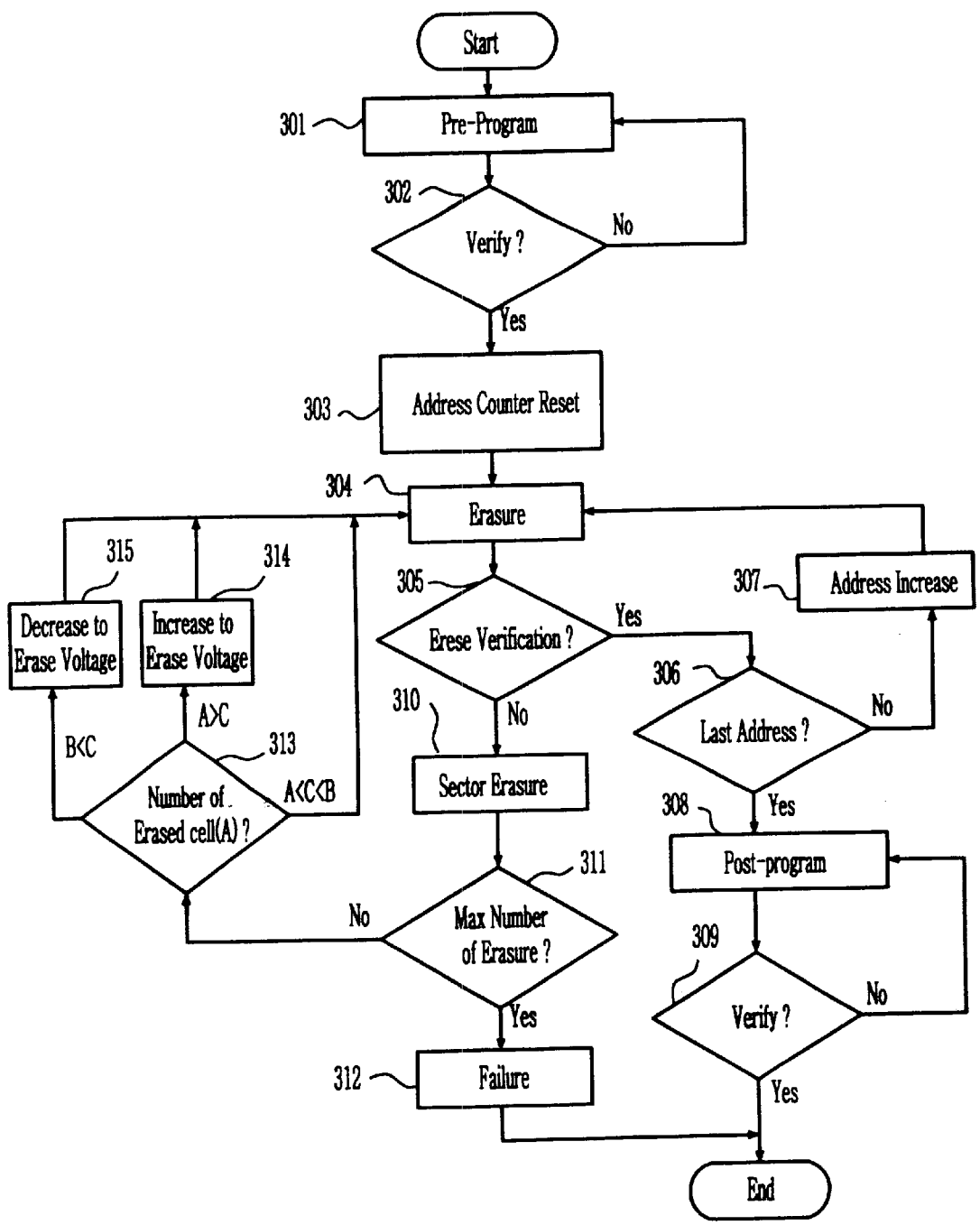
FIG. 3 is a flowchart illustrating a second exemplary method of erasing a flash memory device in accordance with the teachings of the present invention.

Referring now to FIG. 3, another exemplary method of erasing a flash memory device in accordance with the teachings of the present invention will now be explained in detail. Before an erasure operation is performed on a programmed cell in a selected sector, a pre-programming operation for increasing the threshold voltage of the cells in the sector (step 301) and a verification operation to ensure the threshold voltages have been sufficiently raised, (step 302) are performed. After the threshold voltages of all the cells are increased by the pre-programming operation (step 301), an address counter is reset (step 303) and an erasure operation (step 304) is performed on a per sector unit basis. The erasure operation (step 304) is performed by applying an erasure voltage of unit pulse. More specifically, the erasure operation (step 304) is performed by applying an erasure voltage of −10V and 5V to a gate and a substrate, respectively (step 304), wherein the erasure voltage has a pulse width of 10 ms or 5 ms. Then, the erasure state of all the cells is verified on a per address unit basis (step 305).

If the verification (step 305) determines that all the cells are completely erased, it is verified whether the erasure has been performed up to the last address or not (step 306). If the erasure has not been performed up to the last address, the address counter is increased (step 307), and the erasure and verification operations (steps 304 and 305) are performed until cells corresponding to the last address is erased.

If the last address is successfully erased (step 306), in order to avoid the over-erasure problem in cells having a relatively fast erasure characteristic, the erasure operation for the flash memory device is completed through a post-programming operation (step 308) and its verification operation (step 309).

If the verification in step 305 determines that some cells are not erased, all the cells in the sector are erased (step 310). Next, it is verified whether the number of times the erasure operation has been performed exceeds a predetermined maximum number of erasure operations (step 311). If the verification (step 311) determines that the predetermined maximum number of erasure operations is exceeded, it is determined that the device is defective (step 312), and the erasure operation is thus completed. On the other hand, if the verification (step 311) determines that the predetermined maximum number of erasure operations is not exceeded, the number (C) of erased cells in the sector is determined (step 313).

Based on the determination in step 313, if the number of erased cells (C) is below the minimum number of predetermined erased cells (A), it is determined that the erasure rate of the cells is slow. Thus, the erasure operation (step 304) is repeated after increasing the erasure voltage by about 0.5 to about 1V (step 314). In other words, a voltage of about −10.5V to about −11V is applied to a gate and a voltage of about 5.5V to about 6V is applied to the substrate, while maintaining the pulse width (e.g., 10 ms or 5 ms). On the other hand, if the number of erased cells (C) is more than the maximum number of predetermined erased cells (B), it is determined that the erasure rate of the cells is fast. Thus, the erasure operation is preformed (step 304) after reducing the erasure voltage by about 0.5V to about 1V (step 315). In other words, a voltage of about −9.5V to about −9V is applied to the gate and a voltage of about 4V to about 4.5V is applied to the substrate, while maintaining the pulse width (e.g., 10 ms or 5 ms). At this time, one or all of the voltages applied to the gate and the substrate can be varied. Also, if the number of erased cells (C) is between the maximum and minimum number of predetermined erased cells (A) and (B), the erasure operation (step 304) is performed without adjusting the erasure voltage.

As mentioned above, the erasure operations of the disclosed methods are performed in such a way that the number of erased cells is confirmed using an address counter, and either the erasure pulse width or the erasure voltage is changed to periodically vary the erasure rate depending on the process or the operational condition. Therefore, the disclosed methods can stabilize the erasure distribution of cells and can, thus, solve an over-erasure problem. From the foregoing, persons of ordinary skill in the art will appreciate that the disclosed methods of erasing a flash memory device achieve a substantially constant erasure rate even when the internal voltage varies. Such persons will also appreciate that the disclosed methods of erasing a flash memory device solve the over-erasure problem by controlling the voltage and/or the width of the erasure pulse in an erasure operation.

The teachings of the present invention have been illustrated with reference to certain examples. However, those having ordinary skill in the art and access to the teachings of the present invention will recognize that the scope of this patent is not limited to those examples. On the contrary, the scope of this patent encompasses any and all applications, modifications, and embodiments falling within the scope of the appended claims.

What is claimed is:

1. A method of erasing a flash memory device, comprising the steps of:
   (a) performing a pre-program operation in a selected sector having at least some cells;
   (b) adjusting a value in an address counter;
   (c) performing an erasure operation by applying an erasure pulse voltage of all of the cells;
   (d) verifying an erasure state of the cells on a per address unit basis;
   (e) performing a post programming operation if cells corresponding to a last address are erased;
   (f) if some cells are not erased, erasing all the cells;
   (g) determining whether a predetermined maximum number of erasure operations has been exceeded;
   (h) if the predetermined maximum number of the erasure operations has not been exceeded, determining a number of erased cells;
   (i) if the determined number of erased cells is below a predetermined minimum number of erased cells, increasing a pulse width of the erasure pulse voltage and repeating at least steps (c) through (g);
   (j) if the determined number of erased cells is more than a predetermined maximum number of erased cells, reducing the pulse width of the erasure pulse voltage and repeating at least steps (c) through (g);
   (k) if the determined number of erased cells is between the predetermined maximum number of erased cells and the predetermined minimum number of erased cells, repeating at least steps (c) through (g) without changing the width of the erasure pulse voltage; and
   (l) if the predetermined maximum number of erasure operations has been exceeded, determining that the flash memory device is defective.

2. The method of erasing a flash memory device according to claim 1, wherein the erasure pulse voltage comprises a first erasure voltage and a second erasure voltage, and wherein step (c) is performed by applying the first erasure voltage of approximately −10V and an initial pulse width of approximately 10 ms to a gate, and by applying the second erasure voltage of approximately 5V and having an initial pulse width of approximately 10 ms to a substrate.

3. The method of erasing a flash memory device according to claim 1, wherein the erasure pulse voltage comprises a first erasure voltage and a second erasure voltage, and wherein step (c) is performed by applying the first erasure voltage of approximately −10V and having an initial pulse width of approximately 5 ms to a gate, and by applying the second erasure voltage of approximately −10V and having an initial pulse width of approximately 5 ms to a substrate.

4. The method of erasing a flash memory device according to claim 1, wherein the erasure pulse voltage comprises a first erasure voltage and a second erasure voltage, and wherein step (i) is performed by applying the first erasure voltage of approximately −10V and having a pulse width of approximately 20 ms to a gate, and by applying the second erasure voltage of approximately 5V and having a pulse width of approximately 20 ms to a substrate.

5. The method of erasing a flash memory device according to claim 1, wherein the erasure pulse voltage comprises a first erasure voltage and a second erasure voltage, and wherein step (i) is performed by applying the first erasure voltage of approximately −10V and having a pulse width of approximately 10 ms to a gate, and by applying the second erasure voltage of approximately 5V and having a pulse width of approximately 10 ms to a substrate.

6. The method of erasing a flash memory device according to claim 1, wherein the erasure pulse voltage comprises a first erasure voltage and a second erasure voltage, and wherein step (j) is performed by applying the first erasure voltage of approximately −10V and having a pulse width of approximately 5 ms to a gate, and by applying the second erasure voltage of approximately 5V and having a pulse width of 5 ms to a substrate.

7. The method of erasing a flash memory device according to claim 1, wherein the erasure pulse voltage comprises a first erasure voltage and a second erasure voltage, and wherein step (j) is performed by applying the first erasure voltage of approximately −10V and having the pulse width of approximately 2.5 ms to a gate, and by applying the second erasure voltage of approximately 5V and having a pulse width of approximately 2.5 ms to a substrate.

8. A method of erasing a flash memory device, comprising the steps of:
   (a) performing a pre-program operation in a selected sector having at least some cells;
   (b) adjusting a value in an address counter;
   (c) performing an erasure operation by applying an erasure pulse voltage to all of the cells;
   (d) verifying an erasure state of the cells on a per address unit basis;
   (e) performing a post programming operation if cells corresponding to a last address are erased;
   (f) if some cells are not erased, erasing all the cells;
   (g) determining whether a predetermined maximum number of erasure operations has been exceeded;

(h) if the predetermined maximum number of the erasure operations has not been exceeded, determining a number of erased cells;

(i) if the determined number of erased cells is below a predetermined minimum number of erased cells, increasing the erasure pulse voltage and repeating at least steps (c) through (g);

(j) if the determined number of erased cells is more than a predetermined maximum number of erased cells, reducing the erasure pulse voltage and repeating at least steps (c) through (g);

(k) if the determined number of erased cells is between the predetermined maximum number of erased cells and the predetermined minimum number of erased cells, repeating at least steps (c) through (k) without changing the erasure pulse voltage; and (l) if the predetermined maximum number of erasure operations has been exceeded, determining that the flash memory device is defective.

9. The method of erasing a flash memory device according to claim 8, wherein the erasure pulse voltage comprises a first erasure voltage and a second erasure voltage, and wherein step (c) is performed by applying the first erasure voltage of approximately −10V and a pulse width of approximately 10 ms to a gate, and by applying the second erasure voltage of approximately 5V and a pulse width of approximately 10 ms to a substrate.

10. The method of erasing a flash memory device according to claim 8, wherein the erasure pulse voltage comprises a first erasure voltage and a second erasure voltage, and wherein step (c) is performed by applying the first erasure voltage of approximately −10V and a pulse width of approximately 5 ms to a gate, and by applying the second erasure voltage of approximately 5V and a pulse width of approximately 5 ms to a substrate.

11. The method of erasing a flash memory device according to claim 8, wherein the erasure pulse voltage comprises a first erasure voltage and a second erasure voltage, and wherein step (i) is performed by applying the first erasure voltage of about −10.5V to about −11V and a pulse width of 10 ms to a gate, and by applying the second erasure voltage of approximately 5V and a pulse width of approximately 10 ms to a substrate.

12. The method of erasing a flash memory device according to claim 8, wherein the erasure pulse voltage comprises a first erasure voltage and a second erasure voltage, and wherein step (i) is performed by applying the first erasure voltage of approximately −10V and a pulse width of approximately 10 ms to a gate, and by applying the second erasure voltage of approximately 5.5V to approximately 6V and a pulse width of approximately 10 ms to a substrate.

13. The method of erasing a flash memory device according to claim 8, wherein the erasure pulse voltage comprises a first erasure voltage and a second erasure voltage, and wherein step (i) is performed by applying the first erasure voltage of about −10.5V to about −11V and a pulse width of 10 ms to a gate, and by applying the second erasure voltage of approximately 5.5V to about 6V and a pulse width of approximately 10 ms to a substrate.

14. The method of erasing a flash memory device according to claim 8, wherein the erasure pulse voltage comprises a first erasure voltage and a second erasure voltage, and wherein step (i) is performed by applying the first erasure voltage of about −10.5V to about −11V and a pulse width of 10 ms to a gate, and by applying the second erasure voltage of approximately 5V and a pulse width of approximately 10 ms to a substrate.

15. The method of erasing a flash memory device according to claim 8, wherein the erasure pulse voltage comprises a first erasure voltage and a second erasure voltage, and wherein step (i) is performed by applying the first erasure voltage of approximately −10V and a pulse width of approximately 5 ms to a gate, and by applying the second erasure voltage of approximately 5.5V to about 6V and a pulse width of approximately 5 ms to a substrate.

16. The method of erasing a flash memory device according to claim 8, wherein the erasure pulse voltage comprises a first erasure voltage and a second erasure voltage, and wherein step (i) is performed by applying the first erasure voltage of about −10.5V to about −11V and a pulse width of approximately 5 ms to a gate, and by applying the second erasure voltage of approximately 5.5V to about 6V and a pulse width of approximately 5 ms to a substrate.

17. The method of erasing a flash memory device according to claim 8, wherein the erasure pulse voltage comprises a first erasure voltage and a second erasure voltage, and wherein step (j) is performed by applying the first erasure voltage of about −9.5V to about −9V and a pulse width of approximately 10 ms to a gate, and by applying the second erasure voltage of approximately 5V and a pulse width of approximately 10 ms to a substrate.

18. The method of erasing a flash memory device according to claim 8, wherein the erasure pulse voltage comprises a first erasure voltage and a second erasure voltage, and wherein step (j) is performed by applying the first erasure voltage of approximately −10V and a pulse width of approximately 10 ms to a gate, and by applying the second erasure voltage of approximately 4V to about 4.5V and a pulse width of approximately 5 ms to a substrate.

19. The method of erasing a flash memory device according to claim 8, wherein the erasure pulse voltage comprises a first erasure voltage and a second erasure voltage, and wherein step (j) is performed by applying the first erasure voltage of about −9.5V to about −9V and a pulse width of approximately 10 ms to a gate, and by applying the second erasure voltage of approximately 4V to about 4.5V and a pulse width of approximately 10 ms to a substrate.

20. The method of erasing a flash memory device according to claim 8, wherein the erasure pulse voltage comprises a first erasure voltage and a second erasure voltage, and wherein step (j) is performed by applying the first erasure voltage of about −9.5V to about −9V and a pulse width of approximately 5 ms to a gate, and by applying the second erasure voltage of approximately 5V and a pulse width of approximately 5 ms to a substrate.

21. The method of erasing a flash memory device according to claim 8, wherein the erasure pulse voltage comprises a first erasure voltage and a second erasure voltage, and wherein step (j) is performed by applying the first erasure voltage of approximately −10V and a pulse width of 5 ms to a gate, and by applying the second erasure voltage of approximately 4V to about 4.5V and a pulse width of approximately 5 ms to a substrate.

22. The method of erasing a flash memory device according to claim 8, wherein the erasure pulse voltage comprises a first erasure voltage and a second erasure voltage, and wherein step (j) is performed by applying the first erasure voltage of about −9.5V to about −9V and a pulse width of approximately 5 ms to a gate, and by applying the second erasure voltage of approximately 4V to about 4.5V and a pulse width of approximately 5 ms to a substrate.

* * * * *